United States Patent [19]
Ferry

[11] Patent Number: 5,399,106
[45] Date of Patent: Mar. 21, 1995

[54] HIGH PERFORMANCE ELECTRICAL CONNECTOR

[75] Inventor: Julian J. Ferry, Kernersville, N.C.

[73] Assignee: The Whitaker Corporation, Wilmington, Del.

[21] Appl. No.: 184,129

[22] Filed: Jan. 21, 1994

[51] Int. Cl.$^6$ ............................................. H01R 13/66
[52] U.S. Cl. ...................................... 439/620; 333/182
[58] Field of Search ................. 439/620; 333/181–185

[56] References Cited

U.S. PATENT DOCUMENTS

| | | | |
|---|---|---|---|
| 1,995,454 | 3/1935 | Hunter | 179/78 |
| 2,080,217 | 5/1937 | Weaver | 179/78 |
| 3,760,335 | 9/1973 | Roberts | 364/713.11 |
| 3,924,923 | 12/1975 | Shoemaker | 141/312 |
| 4,335,929 | 6/1982 | Abernethy | 439/358 |
| 4,376,922 | 3/1983 | Muzslay | 439/620 |
| 4,589,720 | 5/1986 | Aujla et al. | 439/620 |
| 4,643,509 | 2/1987 | Hollyday et al. | 439/620 |
| 4,653,838 | 3/1987 | Ney et al. | 439/620 |
| 4,676,576 | 6/1987 | Feldberg et al. | 439/620 |
| 4,723,115 | 2/1988 | Apter | 333/181 |
| 5,186,647 | 2/1993 | Denkmann et al. | 439/395 |

FOREIGN PATENT DOCUMENTS 2086151   5/1982   United Kingdom ................ 439/620

*Primary Examiner*—Gary F. Paumen
*Attorney, Agent, or Firm*—William B. Noll

[57] ABSTRACT

The present invention is directed to an improved electrical connector of the type disclosed in U.S. Pat. No. 3,760,335. Though the invention hereof is not limited to the specific construction of such prior art connector, it exemplifies the type of electrical connector that can be modified by the teachings of this invention. Such connector comprises a pair of intermatable housing members, where each said housing member is adapted to be terminated to plural conductors. Each housing is formed of an insulative material and includes a conductor receiving side and a mating side, a plurality of contact receiving cavities extending from the conductor receiving side to the mating side. The cavities are arranged in rows on spaced-apart parallel axes, where adjacent rows are separated by an insulative housing wall. An array of electrical contact terminals are received in the cavities, where each contact terminal includes contact means at its forward end proximate to the mating side, and conductor terminating means proximate to the conductor receiving side. The improvement thereon includes an elongated cavity essentially coextensive with the array of contact terminals, where the elongated cavity receives an electronic device, such as a PCB, having discrete electrical circuit traces along the surfaces thereof. Such traces are arranged to align with selected ones or pairs of conductors, whereby to improve connector performance through capacitive coupling of energy between certain pairs of conductors.

7 Claims, 3 Drawing Sheets

HIGH PERFORMANCE ELECTRICAL CONNECTOR

BACKGROUND OF THE INVENTION

This invention is directed to a high performance electrical connector which reduces crosstalk and yields improved signal transmission qualities that meet or exceed Category 5 requirements for connector hardware by the use of capacitive coupling to affect connector balance.

Crosstalk may be simply defined as that situation when two signal carrying circuits extend close together where the existence of signaling currents in one circuit will tend to set up corresponding currents in the other. With the present trend for increasing transmission rates of electrical connecting devices, there followed the increasing demand for improved performance, particularly in the reduction of crosstalk at frequencies up to 100 MHz. As a consequence of this demand, the Telecommunications Industry Association (TIA) in cooperation with the Electronic Industries Association (EIA) recently developed a proposed standard for Category 5 components, where the transmission requirements of such components are characterized up to 100 MHz and are typically intended for emerging applications with transmission rates up to 100 Mbps. The standard is preliminarily identified as TSB40, August 1992. The invention hereof relates to the hardware, but it is important to note that the hardware is only one major element of a communication system, while another major component is the transmission cable. Thus, it is important to insure the use of the correct connecting component or hardware that is compatible with the transmission characteristics of the cable. Such cables are typically high performance unshielded twisted-pair (UTP) cables, the performance characteristics of which are covered by EIA/TIA bulletin TSB36.

Returning now to the component aspect of a transmission system, one of the more important test parameters for high performance electrical connector hardware, i.e. Category 5, is Near-End Cross-Talk (NEXT) Loss. This may be further defined as a measure of signal coupling from one circuit to another within a connector and is derived from swept frequency voltage measurements on short lengths of 100-ohm twisted-pair test leads terminated to the connector under test. A balanced input signal is applied to a disturbing pair of the connector while the induced signal on the disturbed pair is measured at the near-end of the test leads. In other words, NEXT loss is the way describing the effects of signal coupling causing portions of the signal on one pair to appear on another pair as unwanted noise. In any case, the worst case NEXT loss, see values below in TABLE I, for any combination of disturbing and disturbed pairs is determined by the formula:

NEXT (F)$\geq$NEXT (16)$-$20 Log (F/16) where NEXT (16) is the minimum NEXT loss at 16 MHZ, F is frequency (in MHZ) in the range from 1 MHZ to the highest referenced frequency, and NEXT (F) is the performance at that frequency.

TABLE I

| UTP Connecting Hardware NEXT Loss Limits As Specified in EIA/TIA Document TSB-40 | |
| --- | --- |
| Frequency (MHz) | Category 5 (dB) |
| 1.0 | >65 |
| 4.0 | >65 |
| 8.0 | 62 |
| 10.0 | 60 |
| 16.0 | 56 |
| 20.0 | 54 |
| 25 | 52 |
| 31.25 | 50 |
| 62.5 | 44 |
| 100 | 40 |

While problems associated with crosstalk have been known for years, as evidenced by U.S. Pat. Nos. 1,995,454 and 2,080,217, a major concern has only recently come to the forefront by the current demands for improved performance and higher signal transmission qualities. A recent development is represented by U.S. Pat. No. 5,186,647 to Denkmann et al. A major objective of the patent is to reduce crosstalk between specific conductors in a connector. A preferred embodiment thereof is a panel mount modular jack which includes a pair of lead frames, each comprising four, flat elongated conductors. The lead frames are mounted on top of each other and their conductors are all generally parallel and close to each other throughout a portion of the length of the conductors. The claimed improvement in crosstalk performance is achieved by a selected crossover pattern of the conductors without electrical contact being made because of a reentrant bend in the conductors in the crossover region.

The present invention achieves Category 5 performance by a significant reduction in crosstalk with capacitive coupling through non-ohmic contact. Such performance, and the manner by which it is achieved, will become apparent in the description which follows, particularly when read in conjunction with the accompanying drawings.

SUMMARY OF THE INVENTION

The invention hereof relates to a high performance electrical connector which reduces crosstalk and yields improved signal transmission qualities that meet or exceed Category 5 requirements. An unmodified connector of the type contemplated by this invention is disclosed in U.S. Pat. No. 3,760,335. Such connector comprises a pair of intermatable connector members, where each of the connector members is adapted to be terminated to plural conductors. Each connector member comprises a housing formed of an insulative material with a conductor receiving side and mating side, and a plurality of contact receiving cavities extending from the conductor receiving side to the mating side. The cavities are arranged in rows on spaced-apart parallel axes, where adjacent rows are separated by an insulative housing wall. An array of electrical contact terminals are disposed within the cavities, where each of the contact terminals includes contact means at its forward end proximate to the mating side, and conductor terminating means proximate to the conductor receiving side. The improved feature of this invention is the provision of the insulative housing wall intermediate the array of terminals including an elongated cavity essentially coextensive with the array of contact terminals. Disposed within the elongated cavity is a planar electronic device having discrete electrical circuit traces along the planar surfaces thereof. By the arrangement and alignment of such traces, improved performance through capacitive coupling of energy between certain pairs of conductors is achieved.

DETAILED DESCRIPTION OF PREFERRED EMBODIMENT

This invention is directed to an electrical connector which utilizes an electronic device, preferably a planar device, such as a printed circuit board (PCB), having a multiplicity of discrete circuit traces along the surfaces thereof, where such PCB is interposed between and in non-contact relationship to plural arrays of electrical contacts within such connector, to achieve the enhanced performance needed to exceed Category 5 requirements.

Figure 1:
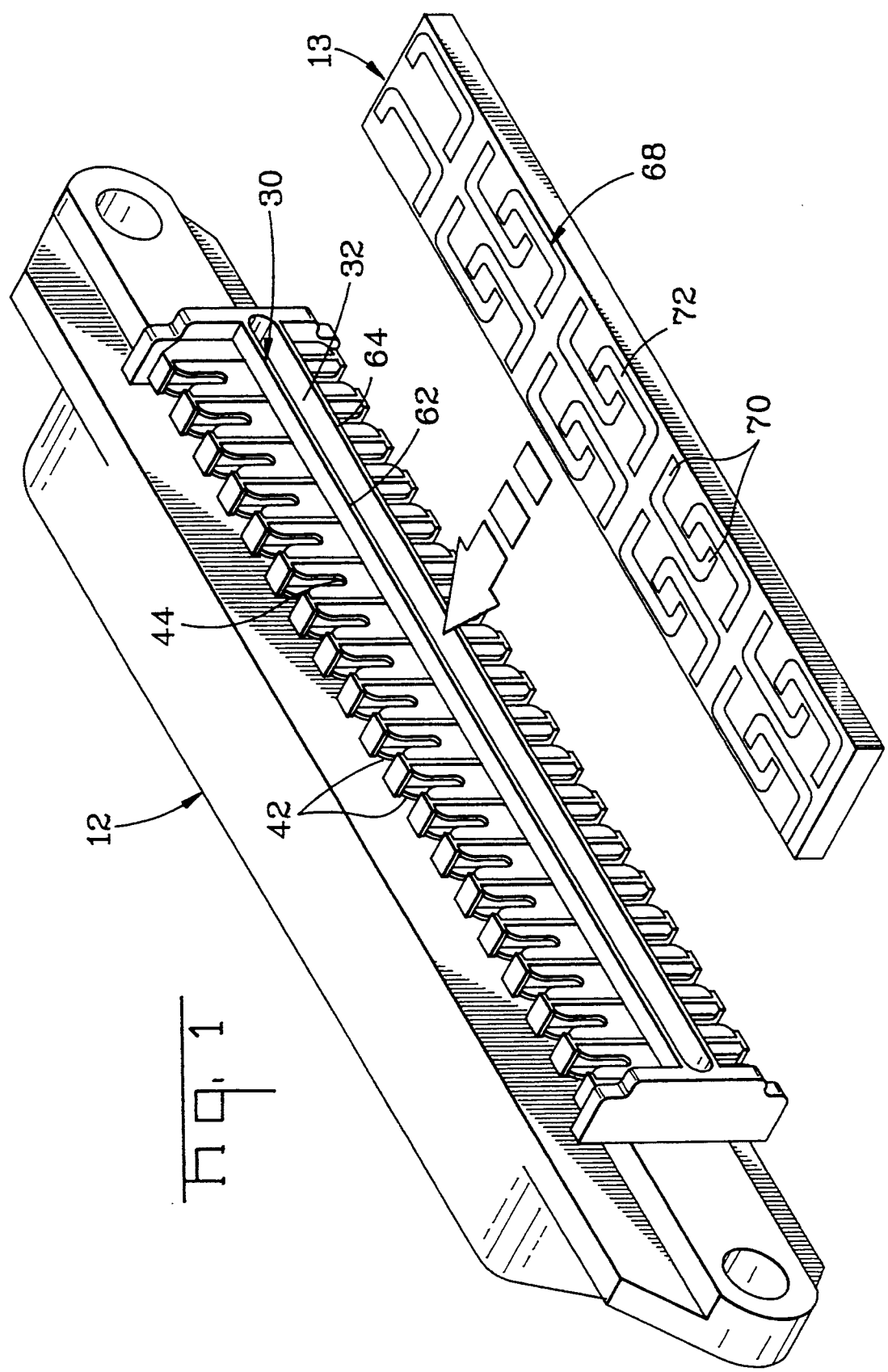
FIG. 1 is a partially exploded perspective view of an electrical connector housing which utilizes capacitive coupling through non-ohmic contact for improved connector performance.
Figure 2:
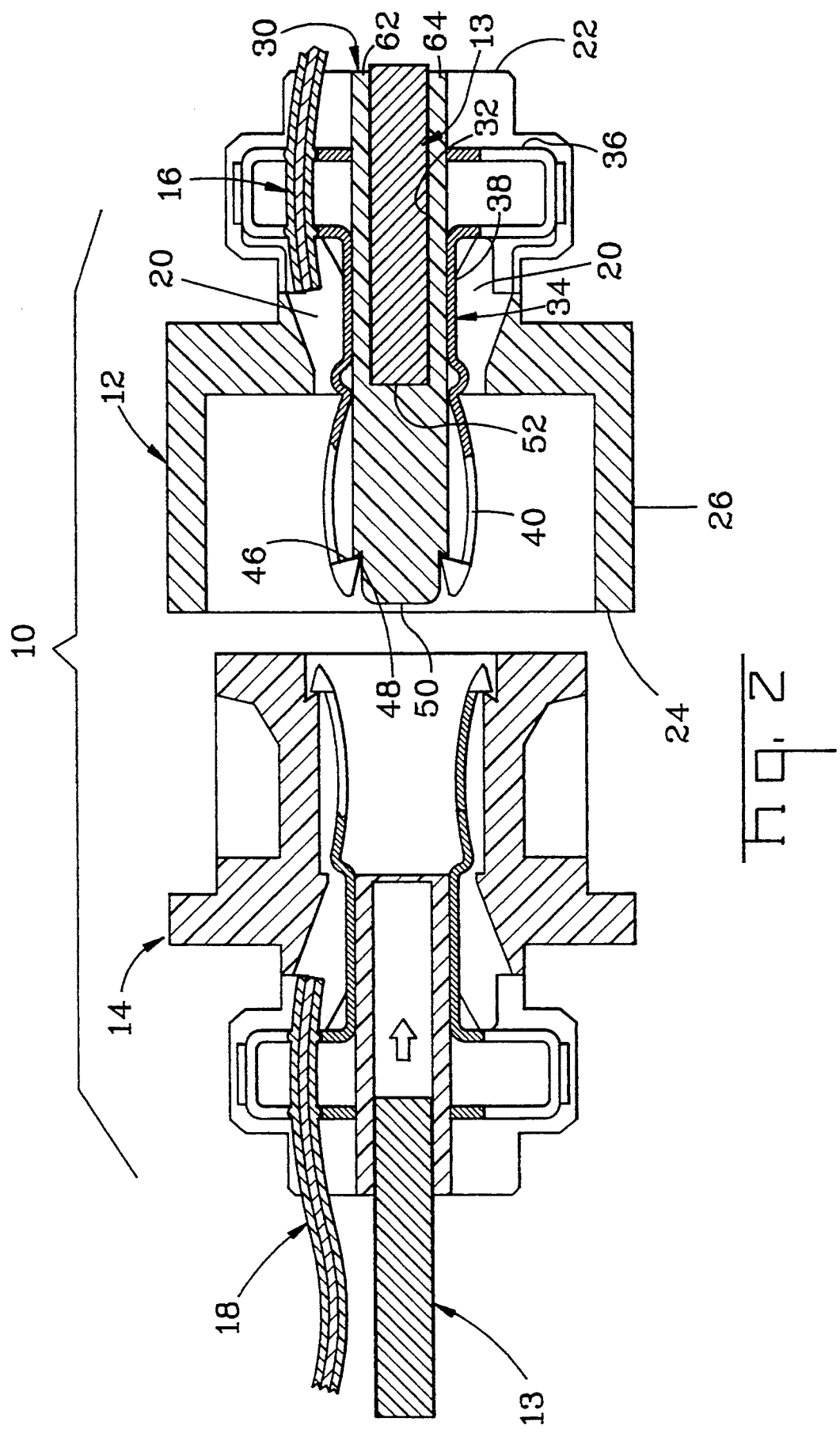
FIG. 2 is a longitudinal sectional view of a pair of intermatable connector housing members modified by the present invention to meet or exceed Category 5 requirements, as hereinafter explained.

FIGS. 1 and 2 represent a typical multi-contact electrical connector 10 which utilizes a specially designed electronic device 13 to achieve the high performance desired.

Referring now in more detail to the Figures, a multi-contact electrical connector in accordance with a preferred embodiment of this invention is disclosed. The connector 10 typically comprises a pair of intermatable connector members 12, 14 such as a plug and receptacle, as known in the art. As will be apparent from the description below, both of these connector members contain a plurality of contact terminals which are electrically and mechanically connected to individual conductors or wires contained in cables 16, 18. When the connector members 12, 14 are coupled to each other the conductors in the cables will then be connected to each other. Though only one connector member will be described in detail, it should be understood that the complementary connector member operates in a similar manner.

The connector housing member 12, illustrated in the Figures, but without the cable 16 in FIG. 1, comprises a dielectric housing of a suitable plastic, having plural arrays of cavities 20 extending from a conductor receiving side 22 to a connector mating side 24. The mating side 24, for the connector housing member 12, includes an encircling shroud 26 for matably receiving therein connector housing member 14.

The embodiment of the Figures illustrates the connector 10 as having a plurality of cavities 20 arranged in two parallel rows and are identical to each other, although the cavities of the lower row are inverted relative to the cavities of the upper row. Between such parallel rows of cavities, a dielectric wall 30 is provided, where such wall preferably includes a continuous, elongated slot 32 coextensive in width to the respective rows of cavities. The purpose for such slot will become apparent in the further description later Each cavity 20 contains a pre-loaded electrical contact terminal 34 comprising a rearward conductor connecting section 36, a shank portion 38, and a contact portion 40. The conductor connecting section 36 is generally U-shaped and has an opening 42 extending into the bight of the U. This opening communicates with slots 44 in each leg of the U which have a width somewhat less than the diameter of the conducting core of the conductor to which the terminal is to be connected. As known in the art, the manner of terminating the various conductors of cable 16 to the contact terminal 34, particularly the conductor connecting portion 36, is insulation displacement, or IDC. In the embodiment of FIG. 2, the contact portion 40 is illustrated as bowed terminating in a latching barb 46 which is adapted to engage a complementary shoulder 48 at the mating end 50 of dielectric wall 30. By this arrangement, the contact terminals are fixed within the housing member, particularly during mating with the complementary housing member 14.

Turning now to the improved feature according to this invention, it will be recalled that in a preferred embodiment an elongated slot 32 has been provided within the dielectric wall 30. According to prior art practices and construction, such wall typically was formed with plural space-apart vertically oriented ribs. However, by this new design, the slot 32 is continuous to lie between and laterally extensive with the two rows of contact terminals 34. The depth 52 thereof is sufficient to cover at least the shank portion 38 of the terminal contact. In a preferred embodiment, for the connector of this invention, the overall wall height is about 0.135 inches, a slot height of about 0.095 inches, leaving a thin wall 62, 64 above and below, of a thickness of about 0.020 inches each. By this arrangement, such slot can readily receive a PCB that is about 0.093 inches in thickness. While a thin wall is preferred, its ultimate thickness will depend considerably on the molding material and molding technique.

To achieve the improved performance according to this invention, as best seen in FIG. 1, an electronic device 12, such as a PCB, is provided for insertion into slot 32. The PCB, along each major surface thereof, is provided with a plurality of discrete traces or paths 68, where such paths are a series of staggered, interfitting "U's". Each path 68 includes a pair of axially arranged arms 70 joined together by a lateral arm 72. The respective arms 70 of a given path 68 are positioned to underlie, or overlie as the case may be, alternate contact terminals 34. In operation, though the paths 68 are electrically insulated from the contact terminals 34 by virtue of the thin walls 62 or 64, i.e. non-ohmic contact, the discrete paths 68 are positioned to receive an induced EMF from the respective contact terminals 34.

Figure 3:
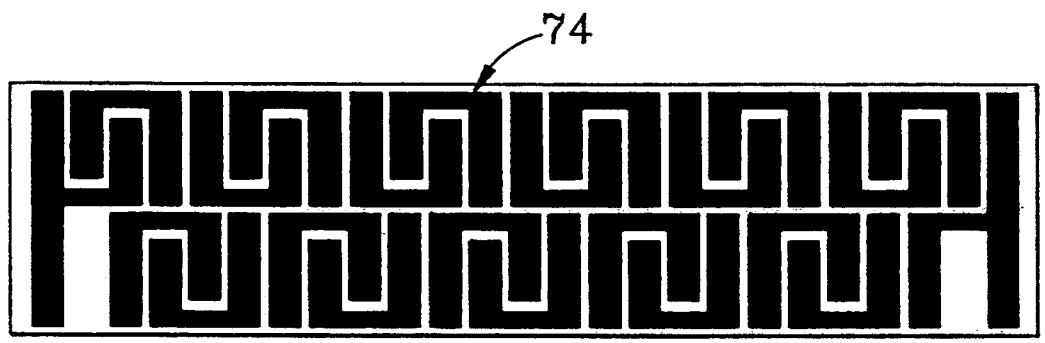
FIGS. 3 to 5 are plan views illustrating alternate trace patterns for electronic coupling devices, or inserts, for coupling energy from one or a pair of conductors, to a second or pair of conductors, through non-ohmic contact.
Figure 4:
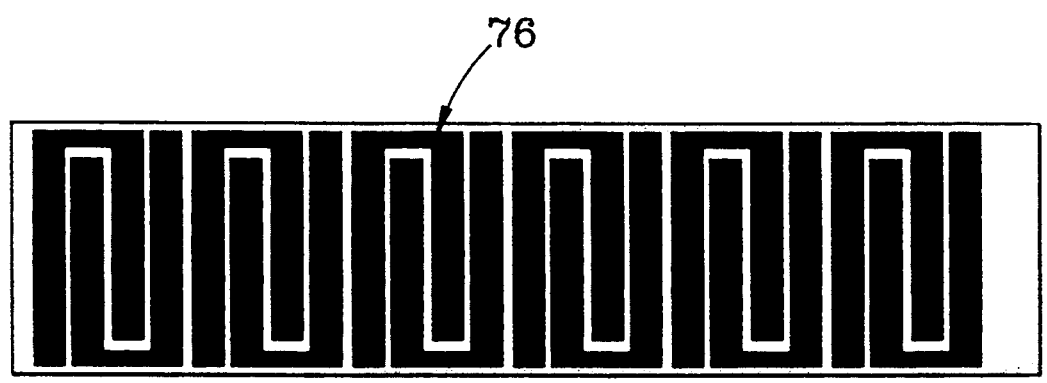
Figure 5:
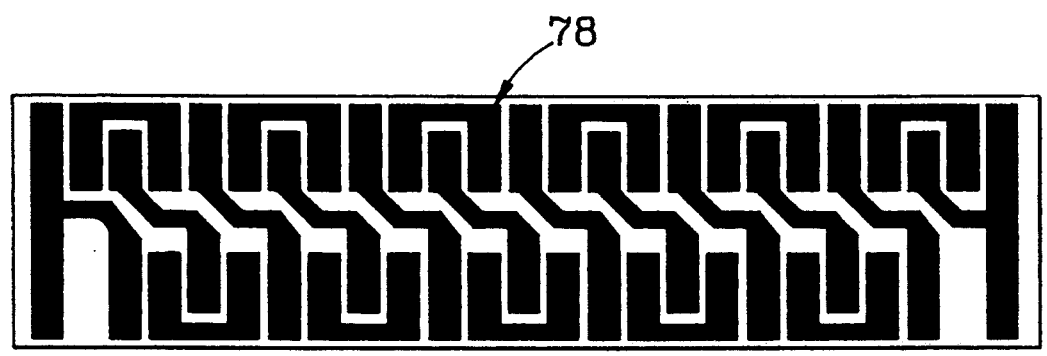

FIGS. 3-5 are plan views of three different trace patterns for the inserts or coupling devices 74, 76, 78. While the preferred manner for developing said patterns is by etching and plating, as known in the art, there are other techniques. That is, the coupling device may be something other than an etched and plated trace on a PCB. A good definition of said device is that it must include a conductive material with a dielectric material situated between the conductive material and the signal-carrying conductors of the connector between which additional coupling is desired. Other forms could be a stamped metal array, specially shaped wires, or additional traces on an existing PCB. The existing PCB could be a computer motherboard, for example, or a board used in other connecting devices. It is important to note that this technique differs from other approaches of the prior art, in that an additional trace is a branch from a signal-carrying trace. In the present invention the trace would not be a part of an existing signal carrying trace, i.e., it would not be ohmically connected.

From the several Figures illustrating exemplary coupling devices, inserts, or PCBs, the traces are generally discrete traces. The traces are positioned so that energy is coupled from one conductor of a pair to one conductor of a second pair in a manner that compensates for imbalances in coupling that are inherent in the existing connector. The method of compensation may be either through better balancing of the coupled signals, or through intentional unbalancing as described in U.S. Pat. No. 5,341,419, by the inventor hereof, the description of which is incorporated herein by reference.

In any case, the capacitive coupling, as illustrated in FIG. 2, may be carried out in the plug, the receptacle, or both. The pattern can be chosen so that energy is coupled from both conductors of one pair to both conductors of a second pair, as illustrated in FIGS. 3 and 5, or by coupling from only one conductor of a pair to one conductor of a second pair, as shown in FIG. 4, or any combination of these two techniques. The first technique represents the preferred approach as better balance can be achieved.

The improved performance of the connector of this invention may best be demonstrated by comparing a prior art connector utilizing the ribbed intermediate wall, i.e. no PCB, with a connector having a PCB disposed within a slot provided in the intermediate wall. The respective connectors are identified as Prior Art and Invention, with the results thereof presented in the TABLE. The data is power sum data from nine pairs adjacent to a single monitored pair. This data was obtained by measuring the crosstalk from each one the nine pairs closest to the monitored pair individually, and then mathematically adding the crosstalk together to obtain one overall number.

TABLE

| Frequency (MHz) | Near End Crosstalk (dB) | |
|---|---|---|
| | Prior Art | Invention |
| 1.000 | −75.234 | −78.386 |
| 4.000 | −64.977 | −67.830 |
| 8.000 | −59.196 | −62.422 |
| 10.000 | −57.325 | −60.659 |
| 16.000 | −53.148 | −56.815 |
| 20.000 | −51.289 | −54.867 |
| 25.000 | −49.319 | −52.801 |
| 31.250 | −47.453 | −51.023 |
| 62.500 | −41.422 | −44.737 |
| 100.000 | −37.521 | −40.944 |

Note that the data is presented as negative numbers. Thus, the higher the number, the better the performance at the designated frequency. It will be recalled from the initial discussion on the performance requirements of Category 5 products that a value of at "40" at 100 MHz was required. By the inclusion of the specially designed electronic device into the connector of the prior art, the improved performance thereof exceeded Category 5 requirements, particularly at the critical frequency of 100 MHz.

I claim:

1. In a multi-contact electrical connector comprising a pair of intermatable connector members, where each said connector member is adapted to be terminated to plural conductors, and each said connector member comprises a housing formed of an insulative material and having a conductor receiving side and a mating side, a plurality of contact receiving cavities extending from said conductor receiving side to said mating side, said cavities being arranged in rows on spaced-apart parallel axes, where adjacent rows are separated by an insulative housing wall, and an array of electrical contact terminals in said cavities, each of said contact terminals having contact means at its forward end proximate to said mating side and conductor terminating means proximate to said conductor receiving side, the improvement comprising in combination therewith the provision of said insulative housing wall including an elongated cavity essentially coextensive with said array of contact terminals, where said elongated cavity receives an electronic device having discrete electrical circuit traces along opposing surfaces thereof and spaced from said contact terminals, whereby to improve connector performance through capacitive coupling of energy between certain pairs of said conductors.

2. The improved multi-contact electrical connector according to claim 1, wherein said electrical circuit traces are separated from said contact terminals by a thin insulative wall, whereby the capacitive coupling is through non-ohmic contact and said improved connector performance is a reduction in crosstalk between respective conductors of terminated electrical contacts.

3. The improved multi-contact electrical connector according to claim 2 wherein said traces are arranged to receive an induced EMF from the contact terminals.

4. The improved multi-contact electrical connector according to claim 2 wherein said traces are arranged so that energy is coupled from two conductors of one pair to two conductors of a second pair.

5. The improved multi-contact electrical connector according claim 2 wherein said traces are arranged so that energy is coupled from a single conductor of a second pair.

6. The improved multi-contact electrical connector according to claim 1 wherein said electronic device is a printed circuit board having a preselected pattern of discrete conductive traces along the major surfaces thereof.

7. The improved multi-contact electrical connector according to claim 6 wherein said traces are transversely patterned along two rows on said surfaces.

* * * * *